United States Patent [19]
Kato

[11] Patent Number: 5,563,441
[45] Date of Patent: Oct. 8, 1996

[54] LEAD FRAME ASSEMBLY INCLUDING A SEMICONDUCTOR DEVICE AND A RESISTANCE WIRE

[75] Inventor: Hazime Kato, Itami, Japan

[73] Assignee: Mitsubishi Denki Kabushiki Kaisha, Tokyo, Japan

[21] Appl. No.: 21,063

[22] Filed: Feb. 23, 1993

[30] Foreign Application Priority Data

Dec. 11, 1992 [JP] Japan .................................. 4-331621

[51] Int. Cl.[6] .................................................. H01L 23/495
[52] U.S. Cl. ........................... 257/666; 257/690; 257/784
[58] Field of Search .................................... 257/666, 670, 257/675, 690, 691, 698, 734, 784, 785, 787, 676

[56] References Cited

FOREIGN PATENT DOCUMENTS 61-67929  4/1986  Japan .................................... 257/784
63-181362 7/1988  Japan .................................... 257/666

Primary Examiner—Carl Whitehead, Jr.
Attorney, Agent, or Firm—Leydig, Voit & Mayer

[57] ABSTRACT

A semiconductor device assembly includes a lead frame having opposed first and second surfaces, a die pad, and a plurality of inner leads, each of two inner leads having an integral projection; a semiconductor element mounted on the die pad; a resistance wire welded to the projections; and metal wires electrically connecting said the semiconductor element with the inner leads.

7 Claims, 3 Drawing Sheets

LEAD FRAME ASSEMBLY INCLUDING A SEMICONDUCTOR DEVICE AND A RESISTANCE WIRE

BACKGROUND OF THE INVENTION

1. Field of the Invention

The present invention relates to a resin-molded semiconductor device and a method of producing a lead frame for the same.

2. Description of the Related Art

FIG. 7 shows, in a plan view, a conventional resin-molded semiconductor device. As shown in FIG. 7, the semiconductor device includes a semiconductor element 2a secured to a surface of a die pad is of a lead frame 1 by a soldering layer 4a. Another semiconductor element 2b is secured to a surface of an island 1b of an inner lead 1h of the lead frame by another soldering layer 4b. As best shown in FIG. 8, a cross-sectional view of the device, a resistance wire 3 is secured to the island 1b and an inner lead 1c by soldering layers 4c. Aluminum electrodes (not shown) of the semiconductor elements 2a and 2b are electrically connected with inner leads 1c and 1d by metal wires 5. The above-described components, including the lead frame 1 and the semiconductor elements 2a and 2b, are sealed with a molding resin 6. In FIGS. 7 and 8, the molding resin 6 is indicated only by broken lines.

When the conventional resin-molded semiconductor device having the above-described construction is completed, the magnitude of the current flowing through the resistance wire 3 is controlled by detecting changes in the voltage generated across the resistance wire 3 by the semiconductor element 2b. On the basis of the current flowing through the resistance wire 3, the magnitude of current which can flow through the semiconductor element 2a can be detected.

In this connection, the above-described resin-molded semiconductor device entails the following problem. The resistance wire 3 generates heat due to current flowing therethrough. Therefore, when tests such as operation tests or temperature cycle tests are performed for a long period of time, the soldering layers 4c at the ends of the resistance wire 3 are deteriorated by heat, thereby causing a change in the resistance of the resistance wire 3. In addition, the resistance of the resistance wire 3 may vary in accordance with the amount of the solder in the layers 4c and the amount of climbing of the solder.

The resin-molded semiconductor device has been fabricated by the following method: The semiconductor elements 2a and 2b are soldered onto the front surface of the lead frame 1 in a reduced atmosphere, and the resistance wire 3, already cut into a prescribed length, is simultaneously soldered. Thereafter, the metal thin wires 5 electrically connecting the aluminum electrodes on the semiconductor elements 2a and 2b with the inner leads 1c and 1d are provided by wire bonding. Then, the resultant structure, including the semiconductor elements 2a and 2b already secured and soldered on the lead frame 1 and the island 1b, respectively, is set in a mold in such a manner that the reverse surface of the lead frame 1 is exposed from the mold. In this condition, the entire structure is resin-molded.

The conventional method entails the following problems. Since the resistance wire 3 is joined to the island 1b by soldering, the resistance provided is of poor accuracy, and it also tends to vary, as described before. Since the resistance wire 3 is secured to the island 1b by soldering after the wire 3 has been cut into a prescribed length, the cutting is an additional step in to the entire fabrication process.

SUMMARY OF THE INVENTION

The present invention has been accomplished to overcome the above-described problems. An object of the present invention is to provide an inexpensive resin-molded semiconductor device having a good temperature cycle characteristic and a highly accurate resistance value, and also to provide a method of producing a lead frame for such a device.

In order to achieve the above object, according to one aspect of the the present invention, there is provided a resin-molded semiconductor device comprising: a lead frame having a plurality of inner leads; a semiconductor element mounted on the lead frame; a pair of projections for positioning welding portions formed on a pair of inner leads among the plurality of inner leads; a resistance wire secured by welding to the pair of projections, the effective length of the resistance wire being determined by the projections; thin metal wires electrically connecting the semiconductor element with the inner leads; and a molding resin sealing the lead frame, the semiconductor element, the projections, the resistance wire and the thin metal wires.

According to another aspect of the present invention, there is provided a method of producing a lead frame having a resistance wire for a resin-molded semiconductor device, the method comprising the steps of: forming, in a plate-shaped material, at least two side edges of portions as a plurality of inner leads and forming a pair of projections for positioning welding portions formed on a pair of inner leads placing the resistance wire on the pair of projections; welding the resistance wire to the projections; and stamping the resultant plate-shaped material together with the resistance wire into the predetermined configuration of a lead frame.

DESCRIPTION OF THE PREFERRED EMBODIMENTS

Embodiment 1

Figure 1:
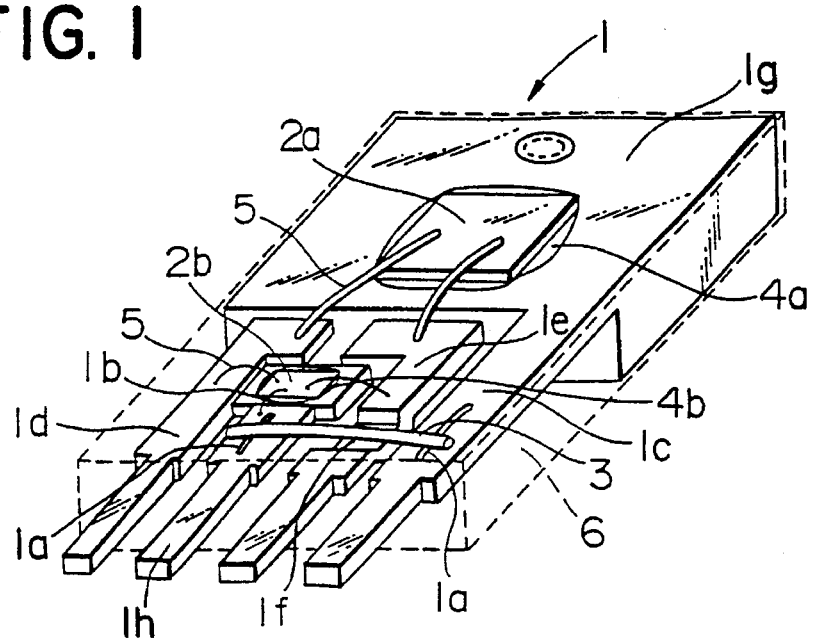
FIG. 1 is a perspective views of a resin-molded semiconductor device according to the first embodiment of the present invention.
Figure 2:
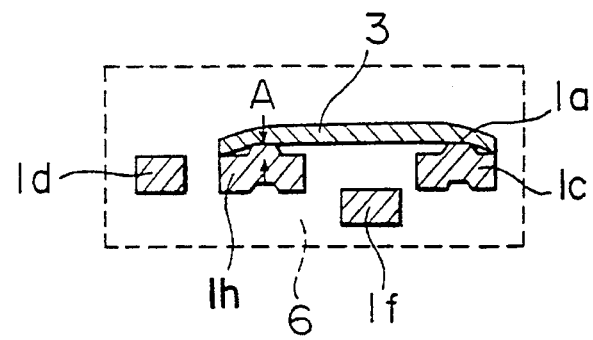
FIG. 2 is a cross-sectional view of the resin-molded semiconductor device shown in FIG. 1, taken along a resistance wire of the device.

A resin-molded semiconductor device according to a first embodiment of the present invention is shown in a perspective view in FIG. 1, and in a cross-sectional view in FIG. 2 in which a lead frame and a resistance wire of the device are shown in section. In the above and the other drawings, identical reference numerals are used to denote the same or corresponding components. Referring to FIGS. 1 and 2, an island 1b of an inner lead 1g and an inner lead 1c to which a resistance wire 3 is to be secured each has a projection 1a formed thereon, the projections 1a serving as raised portions for determining the welding position of the resistance wire 3. The height A (see FIG.2) of the projections 1a ranges from 0.2 to 1.0 mm (preferably of the order of 0.5 mm) when a lead frame 1 having a thickness of 0.5 mm or thereabout is used. However, the height A may be suitably changed in accordance with welding conditions, etc. Where an inner lead 1e is disposed between the pair of projections 1a, if the gap between the secured resistance wire 3 and the inner lead 1e is as small as, for example, 1.5 mm or thereabout, there is the risk that a molding resin 6 will not fill the gap during resin molding, thereby resulting in the generation of a void, or the risk of the resistance wire 3 short-circuiting with the inner lead 1e. In order to prevent these risks, the inner lead 1e may include a stepped portion i.e., recess 1f.

With the resin-molded semiconductor device having the above-described construction, the formation of the projections 1a on the island 1b and the inner lead 1c makes it possible to precisely determine the welding position of the resistance wire 3 so that the resistance of the resistance wire 3 has an improved level of accuracy. Further, the formation of the stepped portion 1f in the inner lead 1e, which must pass below the resistance wire 3, makes it possible to provide an allowance for the length of the resistance wire 3. If desired, the length of the resistance wire 3 may be adjusted by loosening the wire 3. In this way, it is possible to achieve a greater resistance value than that achievable with a conventional device, and hence, to improve the sensitivity of detection. Still further, since the resistance wire 3 is secured by welding without employing soldering, it is possible to greatly improve reliability with respect to temperature tests, etc.

The resistance wire 3 may be made of various materials, such as a copper-containing alloy (e.g., CuNi alloy, Cu 50±10 wt %; Ni 50±10 wt % or FeNi alloy) or aluminum. In addition, the resistance wire 3 may have various shapes, such as a wire-shape or plate-shape. It is possible to weld a resistance wire 3 to inner leads which are adjacent to each other, or to provide a plurality of resistance wires.

Embodiment 2

Figure 3:
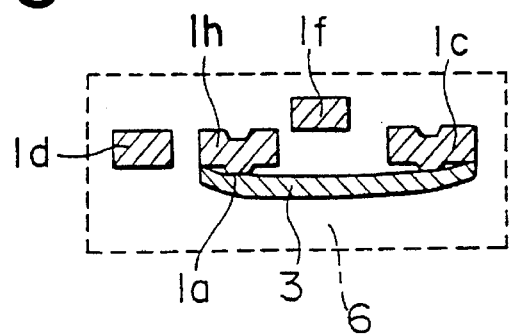
FIG. 3 is a cross-sectional view of a resin-molded semiconductor device according to a second embodiment of the present invention, taken along a resistance wire of the device.

In the first embodiment, the resistance wire 3 is mounted to the same surface of the lead frame 1 as the surface on which a semiconductor element 2a is mounted. However, the resistance wire 3 may be mounted to the opposite surface of the lead frame 1, as shown in FIG. 3. When a resistance wire 3 is being welded to an island 1b and an inner lead 1c, there is the risk of welding dust scattering on the surface where semiconductor elements 2a and 2b are mounted or on the area where thin wires 5 are provided for wire-bonding. In the second embodiment, in which a resistance wire 3 is welded to the surface opposite to the surface on which semiconductor elements 2a and 2b are mounted, it is possible to avoid the above risk.

Embodiment 3

Next, descriptions will be given of a method of producing a lead frame for use in a resin-molded semiconductor device of the types shown in FIGS. 1 and 2.

Figure 4:
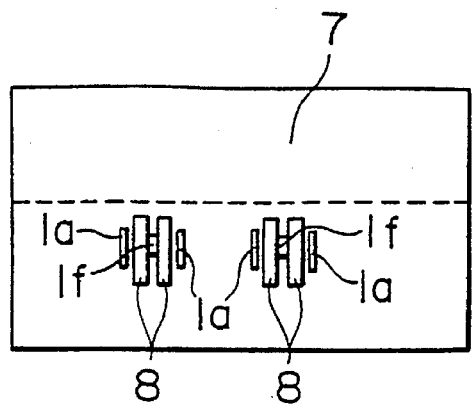
FIG. 4 is a plan view showing the forming of inner leads and projections in a plate-shaped material in a third embodiment of the present invention.
Figure 5:
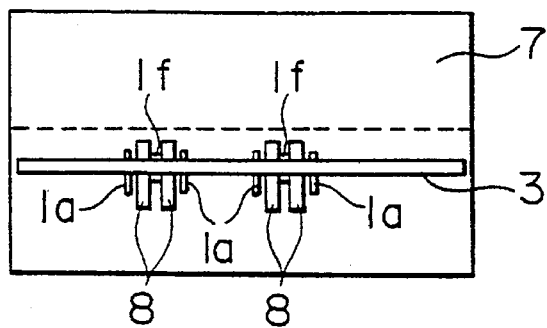
FIG. 5 is a plan view showing the placing of a resistance wire on the projections in the third embodiment.
Figure 6:
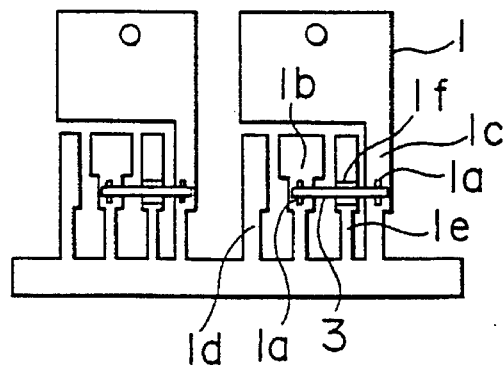
FIG. 6 is a plan view showing the stamping of the plate-shaped material together with the resistance wire into a predetermined lead-frame configuration.
Figure 7:
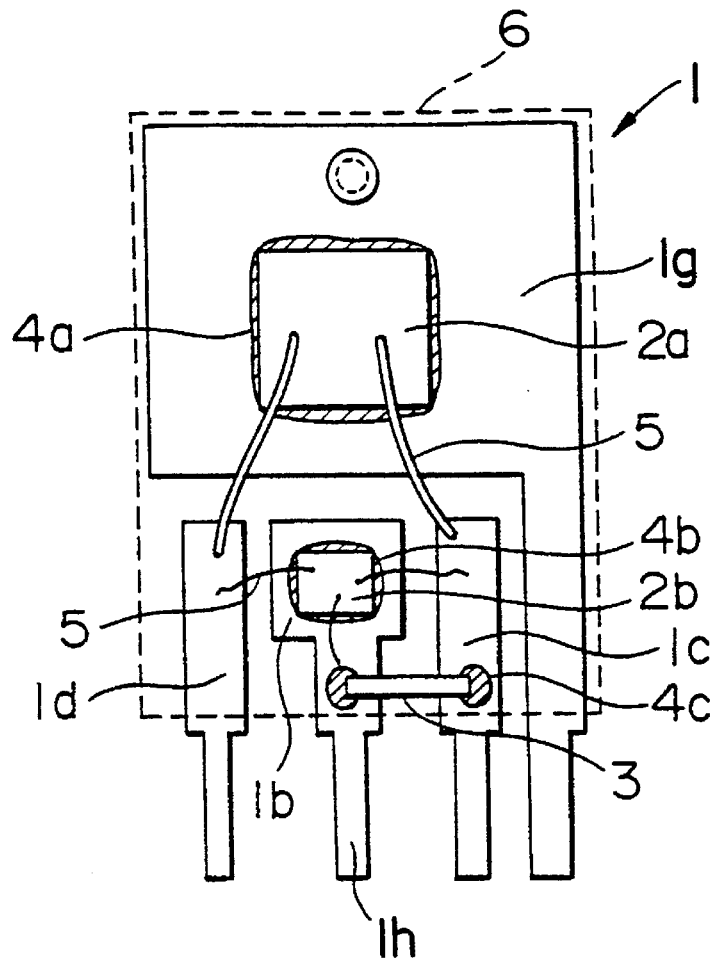
FIG. 7 is a plan view showing a conventional resin-molded semiconductor device.
Figure 8:
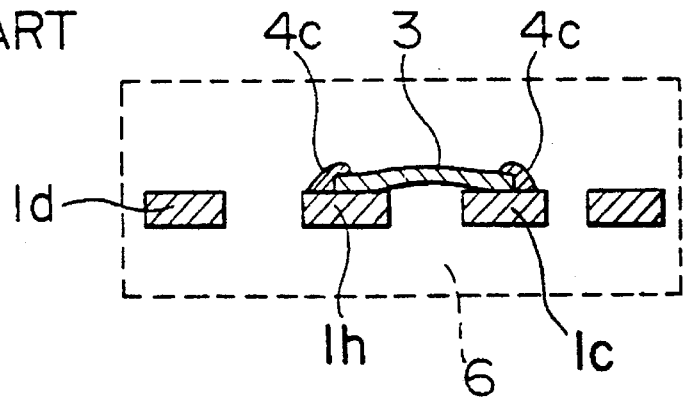
FIG. 8 is a cross-sectional view of the resin-molded semiconductor device shown in FIG. 7, taken along a resistance wire of the device.

First, as shown in FIG. 4, a different-thickness strip material 7, consisting of a plate-shaped material having a Ni-plated surface, is prepared. A pair of punched portions 8 are formed by punching at positions on either side of those portions to form an inner lead 1e which is to pass below a resistance wire 3. Also, a stepped portion 1f is formed, and a pair of projections 1a are simultaneously formed. A plurality of such patterns are formed in the strip material 7, as shown in FIG. 4. Subsequently, as shown in FIG. 5, a length of resistance wire 3 is extended to positions determined by lines interconnecting the pairs of projections 1a and passing above the stepped portions 1f, and the length of the resistance wire 3 is sequentially welded onto the projections 1a. A conventional welding method, such as an electric welding method, may be suitably adopted. Thereafter, the resultant different-thickness strip material 7 and the length of resistance wire 3 are simultaneously stamped into a configuration of lead frames each having inner leads 1c, 1d, etc.

A lead frame 1 is produced by the above-described process. Therefore, it is possible to assure a fixed distance between each pair of projections 1a, thereby making it possible to adjust the resistance of the resistance wire 3 with a high level of precision, and hence, to provide a resin-molded semiconductor device of high reliability. Further, since a different-thickness strip material 7 and a length of resistance wire 3 are stamped together, it is possible to simplify the production process, and hence, to facilitate the preparation of a production line. Thus, it is possible to improve productivity and to provide inexpensive resin-molted semiconductor devices.

As described above, according to the present invention, it is possible to improve the precision of the welding position of a resistance wire, thereby making it possible to improve the accuracy of a resistance value, and hence, to improve reliability. It is also possible to prevent short-circuits between a resistance wire and an inner lead, and to promote filling by a molding resin. Furthermore, since a resistance wire can be connected in the process of producing a lead frame, a production line can be easily prepared, and thus, production costs can be reduced.

What is claimed is:

1. A semiconductor device assembly comprising:

a lead frame having a die pad and at least first, second, and third inner leads, said lead frame having opposed first and second surfaces, wherein each of said first and second inner leads includes an integral projection;

a semiconductor element mounted on said lead frame;

a resistance wire welded to each of said projections; and a metal wire electrically connecting said semiconductor element to said third inner lead.

2. The assembly as claimed in claim 1 wherein said projections are on the first surface of said lead frame and said semiconductor element is mounted on said first surface of said lead frame.

3. The assembly as claimed in claim 1 wherein said projections are on the second surface of said lead frame and said semiconductor element is mounted on said first surface of said lead frame.

4. The assembly as claimed in claim 1 wherein said third inner lead is disposed between said first and second inner leads and said projections have a height that prevents said resistance wire from contacting said third inner lead.

5. The assembly as claimed in claim 1 wherein said third inner lead is disposed between said first and second inner leads, said resistance wire crossing said third inner lead, said third inner lead including a recess where said resistance wire crosses said third inner lead for preventing said resistance wire from contacting said third inner lead.

6. The assembly as claimed in claim 1 wherein said third inner lead is not disposed between said first and second inner leads.

7. The assembly as claimed in claim 1 including a second metal wire connecting said semiconductor element to said first inner lead.

* * * * *